Figure 1:
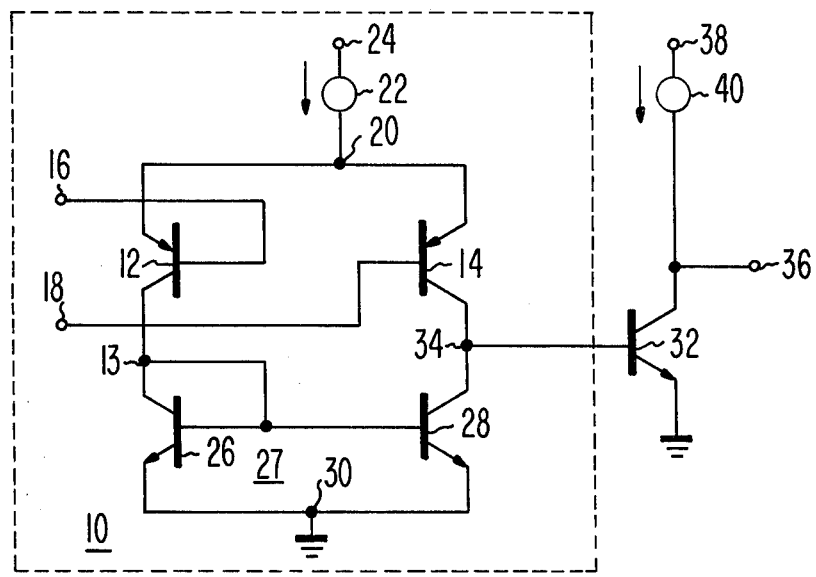

United States Patent [19]

Leidich

[11] 4,064,463
[45] Dec. 20, 1977

[54] AMPLIFIER CIRCUIT

[75] Inventor: Arthur John Leidich, Flemington, N.J.

[73] Assignee: RCA Corporation, New York, N.Y.

[21] Appl. No.: 726,217

[22] Filed: Sept. 24, 1976

[51] Int. Cl.² ............................................. H03F 3/45
[52] U.S. Cl. ..................................... 330/257; 330/288
[58] Field of Search ................. 323/4; 330/14, 17, 19, 330/22, 30 D

[56] References Cited

U.S. PATENT DOCUMENTS

| 3,760,288 | 9/1973 | Leonard | 330/17 X |
| 3,894,290 | 7/1975 | Schoeff | 330/22 X |

Primary Examiner—Lawrence J. Dahl
Attorney, Agent, or Firm—H. Christoffersen; A. L. Limberg

[57] ABSTRACT

A circuit for compensating for the departure from its nominal value of the gain of a current mirror amplifier (CMA). This departure is caused by the presence of base current in one current path of the CMA that is not present in the other current path. The common terminal current of the CMA is sensed and a circuit responsive to this current causes a current to flow at the CMA output terminal that is essentially equal to the aforementioned base currents thereby causing the CMA gain to more closely equal its nominal value. The compensated CMA may be advantageously used in combination with a differential amplifier to reduce the offset voltage of this amplifier.

9 Claims, 2 Drawing Figures

AMPLIFIER CIRCUIT

This application relates to circuits for equalizing bias current flow through the respective input and output paths of a current amplifier. Such circuits may be advantageously used to reduce the offset voltage associated with an operational amplifier.

The offset voltage of an operational amplifier is the deviation of the output dc level from a desired output level when both amplifier input terminals are shorted together. To permit comparisons between the input signal and the offset voltage, this latter voltage is often expressed as a voltage referred to the input terminals. In such a case, the offset voltage may be defined as the input voltage necessary to cause the value of the output voltage to equal an arbitrary value, this arbitrary value generally equalling the reference potential. The input offset voltage generally equals the output offset divided by the amplifier gain.

In operational amplifiers employing a differential amplifier input stage, offset voltages may be caused, in part, by undesired imbalances between current paths of this stage. For example, if such a stage is realized with first and second bipolar transistors with the base electrodes of these transistors comprising the operational amplifier differential input terminals, and the quiescent collector current or the collector-emitter voltage of the first transistor does not equal that of the second, the base-emitter voltage of the first transistor is different from that of the second transistor. The difference in these base-emitter voltages is the offset voltage for this stage.

An offset voltage may have an undesired effect on amplifier performance. For example, when the operational amplifier is used as a true dc amplifier, the signal levels must be much greater than the offset voltage level to obtain suitable operation. As another example, when the operational amplifier is used as a comparator, the presence of an offset may introduce an error in the switching characteristics of the comparator. It is thus apparent that the value of this offset voltage should be minimized.

Figure 2:
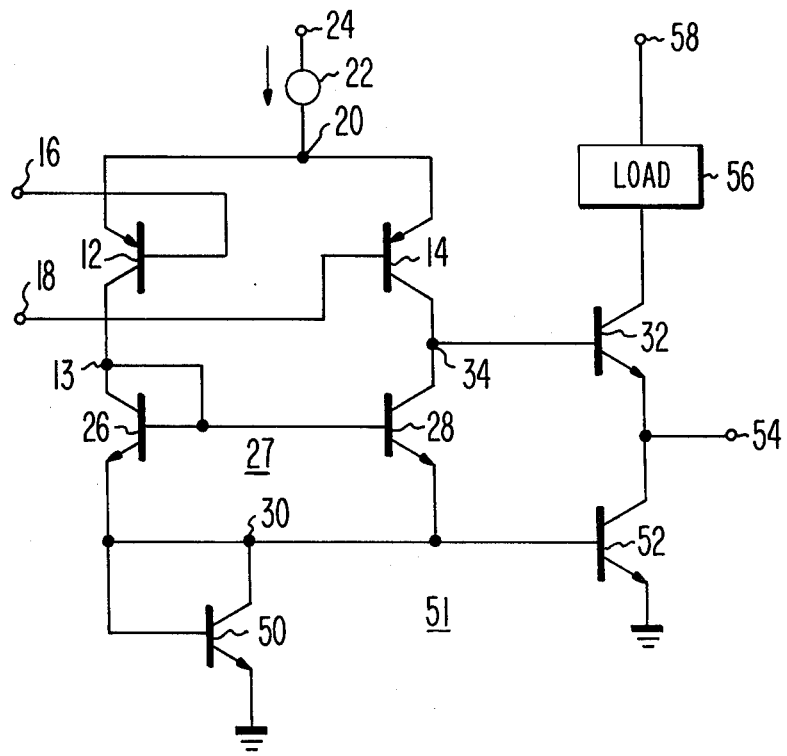

In the drawing, wherein corresponding elements have been given similar reference designations:

FIG. 1 is a schematic diagram of a circuit for reducing offset voltage that is known in the art; and FIG. 2 is a schematic circuit diagram of a preferred embodiment of the invention.

In the circuit of FIG. 1, 10 is a differential input, single-ended output amplifier. The base electrodes of PNP transistors 12 and 14 are connected to input terminals 16 and 18, respectively, while the emitter electrodes of these devices are connected at node 20 to one terminal of current source 22. The other terminal of source 22 is connected to terminal 24. This latter terminal may be connected to a source of operating voltage. NPN transistors 26 and 28 comprise a current mirror amplifier (CMA) 27 which functions as a differential to single-ended converter. The collector electrodes of transistors 26 and 28 are connected to the collector electrodes of transistors 12 and 14, respectively. The base and collector electrodes of transistor 26 are interconnected and this common connection is connected to the base electrode of transistor 28. The emitter electrodes of transistors 26 and 28 are connected at node 30 to a point at a reference potential, herein ground. The base electrode of NPN transistor 32 is connected at node 34 to the collector electrode of transistor 28. The collector electrode of transistor 32 is connected to output terminal 36 while its emitter electrode is connected to ground. Current source 40 is connected between terminals 38 and 36. A source of operating voltage (not shown) may be connected to terminal 38. Current sources 22 and 40 may be realized with large valued resistors or with transistors, the current source outputs being obtained at the respective collector electrodes of such transistors.

Amplifier 10 may represent the input stage of an operational amplifier. It is generally the offset voltage of the input stage that has the greatest effect on operation of an operational amplifier and it is therefore here that it is important that such voltage be minimized. The reason the effect is generally greatest at the input stage is because the input offset voltage of this stage is multiplied by the gains of subsequent stages that are cascaded with the input stage. Also, it is here that the input signal is at its lowest level.

In the operation of the circuit of FIG. 1, assume initially that the base electrode of transistor 32 is disconnected from node 34. A signal voltage may be applied between terminals 16 and 18. If, for example, the signal voltage makes terminal 16 more positive than terminal 18, then transistor 14 conducts more current than transistor 12. Differential-to-single-ended converter 27 supplies a current at node 34 that is essentially equal to the difference in collector currents of transistors 12 and 14. An offset voltage arises between terminals 16 and 18 of amplifier 10 because the quiescent emitter current of transistor 12 is greater than the corresponding emitter current of transistor 14. This is because current through transistor 12 includes a component which supplies the base currents for transistors 26 and 28. That is, the collector current of transistor 12 equals a value $I + 2I_B$, where I equals the collector current through transistor 26 and $2I_B$ equals the combined base currents of transistor 26 and 28.

When transistors 26 and 28 comprise a unity gain CMA, as is the general case when a CMA is used as a differential-to-single-ended converter, then the collector current through transistor 28 equals I. This is also the value of the collector current through transistor 14. Notice that this current is less than the collector current of transistor 12 by an amount $2I_B$. This difference in collector currents and the corresponding difference in emitter currents means that the base-emitter voltage drops of transistors 12 and 14 are unequal. This voltage difference is the amplifier offset voltage.

Another source of offset voltage exists in amplifier 10 because the collector-to-emitter voltages of transistors 12 and 14 are different. The collector electrode of transistor 12 is referenced to within 1 base-emitter voltage drop ($V_{BE}$) of the reference potential by transistor 26 while the collector voltage of transistor 14 is at some indeterminate value. If similar transistors have different collector-to-emitter voltage drops, then their base-emitter voltages will also be different. For bipolar transistors, this phenomenon is known as the Early Effect. A similar phenomenon exists where field effect transistors are used in place of bipolar transistors 12 and 14. The dependence of $V_{BE}$ on a transistor's collector-to-emitter voltage is much weaker than its dependence on emitter current. However, the Early Effect can't be ignored if the offset voltage is to be minimized.

The addition of transistor 32 and source 40 to amplifier 10 represents a technique known in the art for reducing the offset potential. The value of current supplied by source 40 is equal to the current $I_T$ supplied by source 22. If the current gain $\beta$ of transistor 32 equals that of transistors 26 and 28, then the base current required to support a current $I_T$ through transistor 32 equals $2I_B$. The base current for transistor 32 is supplied as a component of the collector current of transistor 14. Thus, the collector currents of both transistors 12 and 14 include a component $2I_B$. This means that the current flow through these devices has been substantially equalized.

Transistor 32 also equalizes the collector voltages of transistors 12 and 14. As stated above, the collector electrode of transistor 12 is referenced to within $1V_{BE}$ of the reference potential by transistor 26. The collector electrode of transistor 14 is referenced to essentially this same value by the base-emitter junction of transistor 32. To further improve this voltage matching, the base-emitter junction area of transistor 32 should be twice as large as that of either transistor 26 or 28. This is because the base current through transistor 32 is twice as large as that through either transistor 26 or 28. Since the base-emitter junction voltage of a transistor is a function of the current density in this region, transistor 32 which has twice the base current should have a junction area twice as large as that of either transistor 26 or 28 to equalize the current density in these three transistors.

The circuit of FIG. 1 causes a slight current imbalance to arise between transistors 12 and 14. This results in an offset voltage that may be objectionable in certain applications. The sum of the emitter currents of transistors 26 and 28 is not the current $I_T$ supplied by source 22 but is instead $\alpha_p I_T$, where $\alpha_p = \beta_p/(\beta_p+1)$, $\beta_p$ being the current gain of PNP transistors 12 and 14. Thus the total base current $2I_B$ through transistors 26 and 28 is not supporting a total collector current $I_T$ in these devices, but a current $\alpha_p I_T - 2I_B$ instead. This is to be contrasted with the current flowing through transistor 32. The collector current through this device equals $I_T$, not $\alpha_p I_T - 2I_B$ as desired. Thus, the base current of transistor 32 is larger than the total base current of transistors 26 and 28. As a result, the collector currents of transistors 12 and 14 are not exactly equal.

To achieve the desired balance, the value of the current supplied by source 40 should equal $\alpha_p I_T - 2I_B$. It would be very difficult as a practical matter to select a current source 40 which would produce a current of the desired value because of the wide variation possible in the current gains of transistors 12 and 14. While it is possible to match the relative values of $\beta_p$ for these devices, the absolute value of $\beta_p$ and hence $\alpha_p$ is difficult to predict. A partial solution to the above problem is known in the art. A transistor having gain characteristics similar to those of transistors 12 and 14 may be cascoded with transistor 32 by connecting its conduction path in series with source 40, with its collector electrode connected to the corresponding electrode of transistor 32. This supplies a current $\alpha_p I_T$ to the collector of transistor 32. However, while the base current of transistor 32 required to support this current nearly equals the desired value, this approach does not provide for a reduction of this current by an amount of $2I_B$, so a slight imbalance still exists.

A circuit for attaining the desired current balance, in accordance with the present invention, is shown in FIG. 2. The base and collector electrodes of NPN transistor 50 are connected to node 30 and to the base electrode of transistor 52 and its emitter electrode is connected to the point at the reference potential, ground. The emitter electrode of transistor 52 is connected to ground while its collector electrode is connected to the emitter electrode of transistor 32. Source 40 (FIG. 1) is not in the circuit. The collector electrode of transistor 32 is biased for normal transistor operation by load 56 which load may be connected at terminal 58 to an operating potential source. Output terminal 54 is connected to the collector electrode of transistor 52. All other connections are unchanged from the circuit of FIG. 1.

In the operation of the circuit of FIG. 2, transistors 50 and 52 comprise a CMA 51 having an input terminal at node 30, an output terminal at node 54 at the collector of transistor 52 and a common terminal connected to ground. The function of this mirror is to provide bias current for transistor 32. In that sense, its function is similar to that of current source 40 in the circuit of FIG. 1. The common terminal current of CMA 27, which equals the combined emitter currents of transistors 26 and 28, comprises the input current to CMA 51. The nominal gain of this CMA is unity so its output current substantially equals this value. The output current is the value of the bias current flowing through the emitter electrode of transistor 32. The current supplied to transistor 32 thus equals the current supplied by source 22 less the current reduction caused by the $\alpha_p$'s of transistors 12 and 14. CMA 51 provides the desired value of bias current to transistor 32, regardless of the value of the $\alpha_p$'s of transistors 12 and 14.

In greater detail, let $I_{E26}$ and $I_{E28}$ equal the emitter currents through transistors 26 and 28, respectively. (Assume that NPN transistors 26, 28, 32, 50 and 52 have identical characteristics including a current gain $\beta_N$ and $\alpha_N = \beta_N/(\beta_N+1)$). These two currents are equal. That is, $$I_{E26} = I_{E28} = I_E$$

The collector current $I_{C12}$ of transistor 12 supplies the collector and base currents for transistor 26 and the base current for transistor 28. Thus, $$I_{C12} = \alpha_N I_E + 2\alpha_N I_E/\beta_N = (\beta_N + 2/\beta_N + 1) I_E$$

The collector current $I_{C14}$ of transistor 14 equals $$\alpha_N I_E + I_{C32}/\beta_N$$

where $I_{C32}$ equals the collector current of transistor 32. Expressing $I_{C32}$ in terms of $I_E$ yields $$I_{C32} = 2\beta_N^2 I_E/(1 + \beta_N)(2 + \beta_N)$$

Substituting the above into the expression for $I_{C14}$ yields $$I_{C14} = (\beta_N^2 + 4\beta_N/(\beta_N+1)(\beta_N+2)) I_E \qquad 1$$

Placing the expression for $I_{C12}$ over the same denominator as the expression for $I_{C14}$ yields $$I_{C12} = (\beta_N^2 + 4\beta_N + 4/(\beta_N+1)(\beta_N+2)) I_E \qquad 2$$

comparing equations (1) and (2), it is clear that $$I_{C12} = I_{C14} + (4/(\beta_N+1)(\beta_N+2)) I_E \qquad 3$$

Equation 3 presents the expression for the relative collector currents of transistors 12 and 14. Ideally, they should be equal. The expression $4I_E/(\beta_N+1)(\beta_N+2)$ thus represents an error term. However, it is quite evident that this error is extremely small and can be shown to be less than the error associated with the circuit of FIG. 1 when this circuit is modified to include the above mentioned cascoded transistor. For example, when the NPN transistor $\beta_N$ is 100, the current imbalance is on the order of only 0.04%. The above analysis assumes perfect matching in the characteristics of the NPN transistors and that the effects of the output impedances of transistors 32 and 52 are negligible. These are reasonable assumptions when the circuit of FIG. 2 is realized as a monolithic integrated circuit.

The circuit of FIG. 2 offers further advantages over the circuit of FIG. 1 when the latter circuit is used in conjunction with the earlier mentioned additional PNP transistor cascoded with transistor 52. Looking at FIG. 1, current source 40 is typically realized with a PNP transistor. This transistor, as well as the additional cascoded device are, when realized on a chip in integrated circuit form, lateral structure devices. This is to be contrasted with the circuit of FIG. 2 where the added transistors (50 and 52) are NPN devices having a vertical structure. For a given current level, these vertical NPN transistors occupy less chip area than do the above mentioned lateral PNP devices. Additonally, the circuit of FIG. 2 offers greater flexibility in the choice of output points. The output signal may be taken at the collector of transistor 32, whereby a signal inversion is obtained, or at the emitter of this transistor where there is no inversion.

FIG. 2, as shown, does not have provisions for equalizing the collector-to-emitter voltages of transistors 12 and 14. The collector electrode of transistor 12 is referenced to within $2V_{BE}$ of the reference potential while the voltage at the collector electrode of transistor 14 is at some unspecified voltage level. The desired voltage matching may be realized, in accordance with the teachings of FIG. 1, simply by connecting terminal 54 to the base electrode of an additional transistor (not shown) whose emitter electrode is connected to ground.

In the circuit of FIG. 2, CMA 51 may be replaced by other CMA configurations known in the art. The invention disclosed herein may be utilized with circuits wherein the input differential amplifier (transistors 12 and 14 in the figures) is realized with insulated gate field effect transistors instead of bipolar devices. Additionally, the circuit of FIG. 2 may be realized with transistors of opposite conductivity type to those shown by appropriate choice of operating potentials and current source polarities.

The teachings of the present application are not restricted to use in conjunction with a differential amplifier. For example, transistors 26, 28, 32, 50 and 52 may be viewed as a CMA having an input terminal 13, an output terminal 34 and a common terminal connected in the present example to a point at a reference potential. Mirror 27 has a nominal gain equal to the relative transconductances of transistors 26 and 28, the transconductance of a transistor being the ratio of the change in collector current caused by a change in base-emitter voltage. In a monolithic integrated circuit where the devices are fabricated with similar doping profiles, the transconductance in a CMA and hence its gain may be controlled by the geometries of the transistors comprising the CMA. For example, if transistors 26 and 28 are vertical transistors, the transconductance of these devices may be controlled by selection of the relative base-emitter junction areas of these transistors. However, as is well known in the art, the gain of mirror 27 departs from a value equal to the transconductance ratio of these devices because the base currents supplied via terminal 13 create an imbalance between the collector currents of the CMA transistors.

In a CMA, having the configuration of CMA 27, whose gain is nominally unity, this imbalance is known to cause the actual gain to equal $\beta/(\beta+2)$. This error manifests itself by causing the CMA output current at 34 to be less than the desired value. The present invention adds a third transistor 32 whose current gain characteristics are similar to those of transistors 26 and 28 of CMA 27. This transistor is biased by means responsive to the current flowing through common terminal 30 of CMA 27. The collector electrode of this added transistor is connected to bias the device for normal operation as, for example, by coupling it through a load to a point at an operating potential level. The level of current supplied to the emitter electrode causes a base current to flow in transistor 32 whose value substantially compensates for the imbalance between the collector currents of transistors 26 and 28. As a result of the above-described improvement, the terminal behavior of the circuitry connected between terminals 13, 34 and the common terminal is, as shown by equation 3, to be that of a CMA whose gain very nearly equals its nominal value. The effects of base currents have been substantially eliminated. Of course, the above-described compensation technique may be extended, using the teachings of the present invention, to CMA configurations different from CMA 27 or to CMA circuits wherein the gain is greater or less than unity. The gain of CMA 51 may be nominally unity for any gain ratio chosen for CMA 27.

What is claimed is:

1. In combination with a first current mirror amplifier including first and second transistors of a first conductivity type each with base and emitter and collector electrodes, an input terminal to which the collector and base electrodes of said first transistor and the base electrode of said second transistor connect, a common terminal to which the emitter electrodes of said first and second transistors connect, and an output terminal to which the collector electrode of said second transistor connects, said first and second transistors exhibiting respective transconductances in 1:G ratio where G is a positive number, each of said first and second transistors having a current gain of $(\beta+1)$ between its base and emitter electrodes;

means for compensating for the base currents of said first and second transistors flowing through the input terminal of said first current mirror amplifier and not through its output terminal causing the current gain of said first current mirror amplifier to depart from a value of $-G$, which means comprises:

an auxiliary current amplifier having a current gain of $-H/(\beta+1)$, where H is a positive $\beta$-independent constant, connected between the common and output terminals of said first current mirror amplifier.

2. A combination as set forth in claim 1 wherein said auxiliary current amplifier includes:

a second current mirror amplifier having an input terminal connected to receive current flow from the common terminal of said first current mirror amplifier and having an output terminal through which flows a current proportional to the received current flow;

a third transistor of said first conductivity type having base and emitter electrodes between which a current gain of ($\beta+1$) is exhibited and having a collector electrode; and means connecting said third transistor to divide said current proportional to the received current flow by ($\beta+1$), including a connection of the output terminal of said second current mirror amplifier to the emitter electrode of said third transistor and including a connection of the base electrode of said third transistor to the output terminal of said first current mirror amplifier.

3. A combination as set forth in claim 1 used as the balanced-to-single-ended signal converter in the differential amplifier input stage of an operational amplifier for reducing its input offset error.

4. In a current mirror amplifier having an input terminal, an output terminal, a common terminal, and first and second transistors of a first conductivity type, each of said first and second transistors having base and emitter and collector electrodes and an associated transconductance and having a current gain substantially equal to ($\beta+1$) between its base and emitter electrodes, ($\beta+1$) being a positive number larger than unity, their emitter electrodes being direct current conductively connected to said common terminal, the collector electrodes of said first and second transistors being direct current conductively connected respectively to said input terminal and said output terminal, and the base electrodes of said first and said second transistors being connected to said input terminal, means for compensating against the problem of the current gain of said current mirror amplifier as between its input and output terminals undesirably departing, due to base currents flowing through said input terminal and not through said output terminal, from a value equal to a ratio of the transconductances of said first and second transistors, which means comprises:

a third transistor of said first conductivity type having a base electrode connected to said output terminal, having a collector electrode coupled to a terminal to which an operating voltage may be applied, having an emitter electrode, and having a current gain of ($\beta+1$) between its base and emitter electrodes; and means having an input circuit connected to receive current flow through the common terminal of said current mirror amplifier and having an output circuit connected for applying a substantially like-valued current to the emitter electrode of said third transistor in the forward direction, thereby to cause the desired compensating current flow through the base electrode of said third transistor.

5. The combination as set forth in claim 4 wherein said means responsive to current flow through the common terminal comprises a second current mirror amplifier (CMA) having input, output and common terminals, said second CMA input terminal connected to said common terminal, said second CMA output terminal connected to the emitter electrode of said third transistor and said second CMA common terminal connected to a point at a reference potential.

6. A current mirror amplifier comprising:
input, output and common terminals;
first, second and third transistors of the same conductivity type, and current gain characteristics, each having base, emitter and collector electrodes and an associated transconductance, said first and said second transistors having their respective transconductances related in a 1:G ratio, the collector electrodes of said first and said second transistors being direct current conductivity connected respectively to said input terminal and to said output terminal, the base electrodes of said first and said second transistors having an interconnection between them to which each of them and said input terminal are direct current conductively connected, the emitter electrodes of said first and said second transistors having an interconnection between them to which each of them and the collector electrode of said third transistor is direct current conductively connected, the emitter electrode of said third transistor being direct current conductively connected to said common terminal;

means providing direct coupled collector-to-base feedback to said third transistor for adjusting its base current to condition it to accept substantially all of the combined emitter currents of said first and said second transistors as its collector and base currents; and means responsive to said base current of said third transistor for adding a current substantially equal to said base current of said third transistor to the collector current of said second transistor at said output terminal, whereby the current gain of said current mirror amplifier as between its input and output terminals which is substantially equal in magnitude to said 1:G ratio is made still more nearly so.

7. A current amplifier as set forth in claim 6 wherein said means for adding a current substantially equal to said base current of said third transistor includes a fourth transistor of the same conductivity type and having substantially the same transconductance as said third transistor, said fourth transistor having a base electrode connected to the base electrode of said third transistor, having an emitter electrode connected to said common terminal, having a collector electrode, and thus being arranged for substantially similar base current flow as said third transistor; and wherein said means for adding a current includes a fifth transistor of said same conductivity type and current gain characteristic as the other of said transistors, having a base electrode connected to said output terminal, having an emitter electrode to which the collector electrode of said fourth transistor is connected, and having a collector electrode biased for operating said fifth transistor in the normal mode.

8. In a current mirror amplifier having an input terminal, an output terminal, a common terminal, and first and second transistors of a first conductivity type, each of said first and second transistors having base and emitter and collector electrodes and an associated transconductance and having a current gain substantially equal to ($\beta+1$) between its base and emitter electrodes, ($\beta+1$) being a positive number larger than unity, their emitter electrodes being direct current conductively connected to said common terminal, the collector electrodes of said first and second transistors being direct current conductively connected respectively to said input terminal and said output terminal, and the base electrode of said first and said second transistors being connected to said input terminal, means for compensating against the problem of the current gain of said current mirror amplifier as between its input and output terminals undesirably departing, due to base currents, flowing through said input terminal and not through said output terminal, from a value equal to a ratio of the transconductances of said first and second transistors, which means comprises:

means having an input circuit connected to receive the current flow through the common terminal of said current mirror amplifier as corresponds to the combined emitter currents of said first and second transistors, and having an output circuit connected to said output terminal, the output circuit of said means responsive to current received by the input circuit of said means to demand a current $1/(\beta+1)$ times as large.

9. An improved current mirror amplifier as set forth in claim 5 used as the balanced-to-single-ended signal converter in the differential amplifier input stage of an operational amplifier for reducing its input offset error.

* * * * *